(12) United States Patent
Mori

(10) Patent No.: US 6,459,396 B2
(45) Date of Patent: Oct. 1, 2002

(54) ELECTRIC CURRENT SWITCH CIRCUIT AND D/A CONVERTER USING SAME

(75) Inventor: Haruya Mori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/809,079

(22) Filed: Mar. 16, 2001

(30) Foreign Application Priority Data

Apr. 24, 2000 (JP) ........................................ 2000-123226

(51) Int. Cl.[7] ................................................ H03M 1/00
(52) U.S. Cl. ........................ 341/134; 341/133; 326/17; 326/19; 326/89
(58) Field of Search ................................ 341/134, 144, 341/143; 257/565, 577, 602, 567, 570; 326/17, 19, 89

(56) References Cited

U.S. PATENT DOCUMENTS 4,510,486 A * 4/1985 Nagano
5,034,601 A * 7/1991 Fukuyama
5,093,585 A * 3/1992 Perkins et al. ............... 326/100

FOREIGN PATENT DOCUMENTS

JP 60-20556 A 2/1985
JP 1-105572 A 4/1989

* cited by examiner

Primary Examiner—Michael Tokar
Assistant Examiner—Linh Van Nguyen
(74) Attorney, Agent, or Firm—Nixon & Vanderhye PC

(57) ABSTRACT

An electric current switch circuit in accordance with the present invention is arranged so that an output of an IIL logic circuit is connected with the base of the first transistor of NPN type that switches ON or OFF the electric current. The first constant current source and the second transistor cause the first transistor to switch ON during a period when the output of the IIL logic circuit is in an OFF state, to switch OFF during a period when the output of the IIL logic circuit is in an ON state. Thus, only a voltage of 0.9V to 1.1V (the sum of a drop voltage across the first resistor and the base-emitter voltage) is applied to the base of the first transistor. Accordingly, a voltage less than the withstand voltage of the IIL logic circuit is applied to the base of the first transistor. This allows the electric current switch to be realized by three transistors and one resistor when the first current source is an NPN transistor and, therefore, in an electric current switch that switches ON or OFF the electric current in response to the output of the IIL logic circuit, it is possible to reduce the circuit scale and the power consumption and to lower the lower limit of the output voltage.

11 Claims, 7 Drawing Sheets

ELECTRIC CURRENT SWITCH CIRCUIT AND D/A CONVERTER USING SAME

FIELD OF THE INVENTION

The present invention relates to an electric current switch circuit that switches ON or OFF the electric current in response to an output of an injection bipolar logic circuit (hereinafter referred to as an IIL (Integrated Injection Logic) logic current and relates to a digital to analog converter (hereinafter referred to as a D/A converter) for which such an electric current switch circuit is suitable.

BACKGROUND OF THE INVENTION

In an IIL logic circuit that realizes large scale integration and low power consumption, the withstand voltage of the IIL transistor to be sued is low. When connecting the IIL logic circuit with an external circuit, no more than about 1.5 voltage, the usual withstand voltage of the IIL transistor, should be applied to the output of the IIL logic circuit.

FIG. 7 is an electric circuit diagram showing a structure of a D/A converter 1 that is realized by a plurality of typical conventional electric current switch circuits which receive the outputs of the respective IIL logic circuits. The D/A converter 1 is an N-bit R-2R resistor ladder type. The D/A converter 1 is composed of electric current switch circuits sw1, sw2, . . . , and swN. A line 2 to which a reference voltage Vref is applied is commonly connected with one end of resistors r11, r12, . . . , and r1N in the respective electric current switch circuits sw1, sw2, . . . and swN. Resistors r22, r23, . . . , and r2N are connected between the other ends of adjacent resistors r11, r12, . . . , and r1N. Such other ends are electrically switched ON and/or OFF with respect to a ground line by the respective electric current switch circuits sw1, sw2, . . . , and swN. The resistors r11, r12, . . . , and r1N and the resistors r22 r23, . . . and r2N constitute a resistor ladder circuit. The reference voltage Vref is divided in accordance with the combinations of the resistors r11, r12, . . . , and r1N and the resistors r22, r23, . . . ,and r2N so as to be outputted to an output terminal 3 as a D/A converted signal from the above-mentioned other end of the resistor r1N in the electric current switch circuit swN of the last stage.

In the electric current switch circuit sw1, transistors of NPN type (hereinafter referred to as NPN transistors) q1 and q2 form a pair. The emitters of the NPN transistors q1 and q2 are commonly connected with the collector of a NPN transistor q3, and its emitter is connected with the ground through a resistor r1. In the NPN transistor q1, a constant voltage of 1.4V is applied to the base, and the collector is connected with a point connecting the resistor r11 with the resistor r22. In the NPN transistor q2, the collector is connected with the line 2, the base is connected with a point connecting transistors of PNP type (hereinafter referred to as PNP transistors) q4 and q5 that are provided so as to be connected in series with each other between the ground and a power source line 4 to which a high level Vcc is applied. A voltage of 1.4V is applied to the base of the PNP transistor q5. The point connecting PNP transistors q4 with q5, i.e., the base of the NPN transistor q2 is connected with the collector of an NPN transistor q6. The base of the NPN transistor q6 receives an output of the IIL logic circuit c1, and is connected with the power source line 4 to which the high level Vcc is applied. The emitter of the NPN transistor q6 is connected with the ground line, i.e., is grounded.

The D/A converter 1 is further provided with a constant current generation circuit 5 in which a constant electric current obtained by multiplying constant current Iref by a predetermined numeral value. The constant electric current is generated by (1) a pair of NPN transistors q11 and q12 that constitute a current mirror circuit, (2) a NPN transistor q13, (3) resistors r31 through r33, and (4) a constant current source f. The constant electric current flows to the ground through the NPN transistor q3 that constitute a current mirror circuit together with the NPN transistors q11 and q12. The constant electric current flows to the ground through an NPN transistor q14 that constitute a current mirror circuit together with the NPN transistors q11 and q12. This allows the constant electric current to flow through a PNP transistor q15 that is connected in series with the NPN transistor q14. Accordingly, the constant electric current flows through the respective PNP transistors q4 and q7 that constitute a current mirror circuit together with the PNP transistors q15.

With the electric current switch circuit sw1 having the above structure, the current that flows to the ground through the NPN transistor q3 is switched ON or OFF in accordance with the difference between the base voltages of the NPN transistors q1 and q2. More specifically, when the base voltage of the NPN transistor q1 is fully greater than that of the NPN transistor q2, the electric current flows to the NPN transistor q3 from the resistor ladder circuit. In contrast, when the base voltage of the NPN transistor q1 is fully smaller than that of the NPN transistor q2, the electric current does not flow to the NPN transistor q3 from the resistor ladder circuit. The electric current switch circuits sw1 through swN are connected in series with each other in accordance with the resolution required for the D/A converter. Thus, the D/A converter 1 of an N-bit R-2R resistor ladder type is constituted. Note that the electric current switch circuits sw2 through swN have the same structure as the electric current switch circuits sw1. The electric current switch circuits sw2 through swN switch ON and/or OFF in response to the outputs of the respective IIL logic circuits c2 through cN.

In order not to have the NPN transistor q3 saturated so as to maintain the constant electric current, it is always necessary to apply a voltage of not less than (Vr1+Vdsat) to the collector of the NPN transistor q3. Note that the voltage Vr1 indicates the drop voltage across the resistor r1, and the voltage Vdsat indicates the saturated voltage of the NPN transistor q3. The. saturated voltage Vdsat falls within the range of about 0.1V and 0.3V. When the drop voltage Vr1 is equal to 0.3V, it is necessary to apply a voltage of not less than 0.6V to the collector of the NPN transistor q3. The drop voltage Vbe between the base-emitter of the transistor falls within the range of about 0.6V and 0.8V. Accordingly, it is necessary to satisfy the following requirement, i.e., it is necessary to apply a voltage of not less than 1.4V (=Vr1+Vdsat+Vbe) to at least one of the bases of the NPN transistors q1 and q2. According to the electric current switch circuit sw1, in order to satisfy the above requirement, a constant voltage of 1.4V is applied to the base of the NPN transistor q1, as has been described above, so as to carry out the switching operation by changing the base voltage of the NPN transistor q2.

In the mean time, when considering the difference between the base voltages of the NPN transistors q1 and q2 required for the switching, in order to make the collector current ratio of the NPN transistors q1 and q2 be 1:1000 so as to fully carry out the switching, it is necessary to maintain the voltage difference of (VT×ln(1000)) between the base voltages of the NPN transistors q1 and q2. Note that VT indicates a thermal voltage, and has a voltage of about 26 mV when the element temperature is at 25° C. while 37 mV when the element temperature is at 150° C. A voltage of not less than 256 mV is required for the voltage difference between the base voltages of the NPN transistors q1 and q2, when it is assumed that VT is equal to 37 mV. Thus, in order to fully carry out the switching, it is necessary for the base voltage of the NPN transistor q2 to be a voltage of not less than 1.66V or a voltage of not more than 1.14V which results from 1.4V±256 mV.

When directly connecting the bases of the NPN transistors q2 with the outputs of the IIL logic circuits c1 through cN, respectively, it is likely that a voltage of not less than 1.66V is applied to the respective IIL logic circuits c1 through cN. This means that a voltage greater than the withstand voltage of the respective IIL logic circuits c1 through cN is often applied so as to cause lower reliability or this deficiency, a level change circuit is needed by which the voltage applied to the output off the IIL logic circuit c1 is suppressed to be not more than the withstand voltage of the IIL transistor and the base voltage of the NPN transistor q2 is suppressed to a voltage of not less than 1.66V and of not more than 1.14V. In the electric current switch circuits sw1 through swN, such a level change circuit is composed of the PNP transistors q4, q5, and q7 and the NPN transistors q6.

More specifically, each output of the IIL logic circuits c1 through cN is connected with the base of the NPN transistor q6 to which a bias electric current is applied by the PNP transistor q7. The PNP transistor q4 supplies the base of the NPN transistor q2 with a bias electric current. The collector of the PNP transistor q4 is connected with the emitter of the PNP transistor q5 whose collector is connected with the ground so that the PNP transistor q4 has not saturated.

When the outputs of the respective IIL logic circuits c1 through cN are in an ON state, each bias electric currents applied by the PNP transistor q7 flows into each of the respective IIL logic circuits c1 through cN. This causes the base voltage of the NPN transistor q6 to be substantially zero so as to switch off the NPN transistor q6. As a result, the base voltage of the NPN transistor q2 increases and the PNP transistor q5 becomes in operation, thereby resulting in that the base voltage of the NPN transistor q2 becomes (1.4V+Vbe), i.e., falls within the range of 2.0V and 2.2V.

In contrast, when the outputs of the respective IIL logic circuits c1 through cN are in an OFF state, each bias electric current applied by the PNP transistor q7 flows not into each of the IIL logic circuits c1 through cN but into the base of the NPN transistor q6. This causes the base voltage of the NPN transistor q6 to be Vbe, i.e., to fall within a range of 0.6V and 0.8V so as to switch ON the NPN transistor q6. As a result, the base voltage of the NPN transistor q2 decreases to substantially zero.

The base voltage of the NPN transistor q2 receives a voltage of a range of 2.0V and 2.2V or a voltage of about zero, thus the switching operation of the electric current is carried out. However, as has been described above, the voltage of not more than 0.8V is applied to each output of the IIL logic circuits c1 through cN so that a voltage of more than the withstand voltage of the IIL transistor is not applied.

According to the foregoing convention art, seven transistors were required (q1 through q7) and one resistor r1 for each of the switch circuits sw1 through swN including the level change circuit. Accordingly, the D/A converter 1 having such a plurality of electric current switch circuits occupies a large mounting area on an IC chip. This causes the problems that it is impossible to mount the D/A converter 1 on an IC chip of a compact package and the manufacturing cost increases.

In the case where an electric current switch is in an OFF state, i.e., the base voltage of the NPN transistor q2 is greater than that of the NPN transistor q1, the electric current flowing through the collector of the NPN transistor q2 is not necessary for the operation of the D/A converter 1. This raises the problem of unnecessary power consumption.

Further, the following problems also arise. It becomes necessary to apply a voltage of at least 1.4V to the base of the NPN transistor q1 because of the foregoing reason. It is not possible to make the collector voltage of the NPN transistor q1 be not more than 0.9V (=Vr1+Vdsat(q3)+Vdsat (q1)) so as not to have the NPN transistor q1 saturated. This restricts applicability of the circuit in that the D/A converter 1 is made to be operated at a low power source voltage.

SUMMARY OF THE INVENTION

It is an object of the present invention to provide an electric current switch circuit that is capable of reducing the lower limit of the output voltage with small circuit scale and low power consumption, and also relates to provide a D/A converter using such an electric current switch circuit.

In order to achieve the foregoing object, an electric current switch circuit in accordance with the present invention which switches ON and/or OFF the electric current in response to an output of an IIL logic circuit is characterized by including (a) a first transistor of NPN type, that has a base connected with an output terminal of the IIL logic circuit and a collector that is an output terminal through which an electric current flows, for switching the electric current, (b) a first resistor through which an emitter of the first transistor is grounded, (c) a first constant current source for supplying the base of the first transistor with a bias electric current, (d) a second transistor of PNP type, that has an emitter connected with the base of the first transistor and a collector being grounded, for controlling (limiting) a voltage of the output terminal of the IIL logic circuit, and (d) a voltage bias circuit for supplying the base of the second transistor with a bias voltage.

With this arrangement, when the output of the ILL logic circuit is in an OFF state, the base of the first transistor receives the bias voltage that is higher by the voltage Vbe of the second transistor than the bias voltage outputted from the voltage bias circuit. The emitter of the first transistor receives the voltage which is lower by the voltage Vbe of the first transistor than the base voltage of the first transistor. In other words, the emitter of the first transistor receives substantially the same voltage as the above-mentioned bias voltage. As a result, the first transistor switches ON so that a constant electric current flows through the collector toward the output terminal. When the drop voltage VR1 across the first resistor is 0.3V, for example, only a voltage of 0.9V to 1.1V (=VR1+Vbe) is applied to the base of the first transistor that is connected with the output terminal of the IIL logic circuit, even when the IIL transistor is in an OFF state. Accordingly, a voltage more than the withstand voltage of the IIL transistor is not applied to the base of the first transistor.

In contrast, when the IIL transistor is in an ON state, the base voltage of the first transistor substantially becomes zero voltage. The first transistor switches OFF so as to make substantially zero the electric current flowing through the output terminal. Thus, it is possible to realize an electric current switch circuit that can carry out the switching in accordance with the output of the IIL logic circuit, similar to the case where the conventional electric current switch circuit and the When it is assumed that the first constant current source is realized by a single PNP transistor, the electric current switch circuit can be realized by three transistors and one resistor according to the electric current switch circuit of the present invention. This allows the chip area to be reduced. Especially, in a circuit which includes a plurality of the foregoing electric current switch circuits, like a D/A converter, it is possible to mount them on an IC in a compact package and is possible to avoid an increase in manufacturing cost.

Unlike the conventional electric current switch circuit, since there are no structures for generating and consuming the constant electric current, other than the first constant current source for driving the first transistor, it is possible to reduce power consumption, irrespective of the switching ON or OFF of the first transistor.

Further, it is possible to lower the voltage of the output terminal for electric current, i.e., the collector voltage of the first transistor up to 0.6V (=VR1+Vsat). Therefore, it is possible to relieve the restriction required for operating the D/A converter or other devices having the foregoing electric current switch circuits in a lower source voltage. It is possible to lower the lower limit of the output voltage, accordingly.

According to an exemplary embodiment of the electric current switch circuit of the present invention, the foregoing voltage bias circuit is provided with a feedback circuit in which an input is applied through an input terminal for the electric current and the bias voltage is sent to the base of the second transistor through an output, a third transistor having a collector that serves as the input terminal for the electric current, a second resistor through which an emitter of the third transistor is grounded, a second constant current source for supplying a base of the third transistor with a bias electric current, and a fourth transistor having an emitter connected with the base of the third transistor, a collector grounded, and a base connected with the output terminal of the feedback circuit.

With this arrangement, the output voltage of the feedback circuit is controlled so that the electric current, which flowed to the input terminal for the electric current, flows to the collector of the third transistor.

Accordingly, when the output of the IIL logic circuit is in an OFF state, the same electric current which flowed to the input terminal for the electric current flows through the output terminal. Further, when the circuit elements constituting the electric current switch circuit have the same characteristics as those of the circuit elements constituting the voltage bias circuit, the above-mentioned electric current is not affected by the changes of the characteristics of the circuit element, the ambient temperatures, or other factors.

According to another exemplary embodiment of the electric current switch circuit of the present invention, the feedback circuit is constituted by a fifth transistor of NPN type having a collector to which a power source voltage is applied, an emitter grounded through a third resistor that serves as the output of the feedback circuit, and a base that serves as the input of the feedback circuit.

With this arrangement, it is possible to realize the feedback circuit by an extremely simple circuit configuration.

According to another exemplary embodiment of the electric current switch circuit of the present invention, the feedback circuit is constituted by an operational amplifier. More specifically, the input of the feedback circuit is sent to a non-inverting terminal of the operational amplifier, a reference voltage of a reference voltage source is sent to an inverting input terminal of the operational amplifier, and an output terminal of the operational amplifier serves as the output of the feedback circuit.

With this arrangement, it is possible to obtain from the output terminal the output electric current that has the same value as the electric current that flowed through the input terminal for the electric current while the voltage of the input terminal for the electric current is maintained to have the same value as the reference voltage.

According to another exemplary embodiment of the electric current switch circuit of the present invention, the collector of the fifth transistor is connected with a collector of a sixth transistor of PNP type that serves as an input of a current mirror circuit, and seventh and eighth transistors of PNP type that serve as the respective first and second constant current sources as well as serve as respective outputs of the current mirror circuit.

With this arrangement, it is possible to obtain the reference electric currents outputted from the respective first and second constant current sources through the collector of the fifth transistor.

Accordingly, it is not necessary to newly provide current sources for generating the reference electric currents. It is possible to simplify the circuit configuration and to save power consumption.

A D/A converter in accordance with an exemplary embodiment of the present invention is provided with a plurality of electric current switch circuits having the structure of any one of the above-mentioned ones that are connected in series with each other in which the bases of the respective second transistors are commonly connected with each other.

With this arrangement, it is possible to obtain many electric current switch outputs that can be independently switched ON and/or OFF and that have a single electric current value. Thus, the D/A converter having many electric current switch circuits can be mounted on an IC in a compact package. Further, it is possible to avoid increased manufacturing costs.

The scope of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of present invention. illustration only, and thus, are not limitative of the present invention.

DESCRIPTION OF THE EMBODIMENTS

Figure 1:
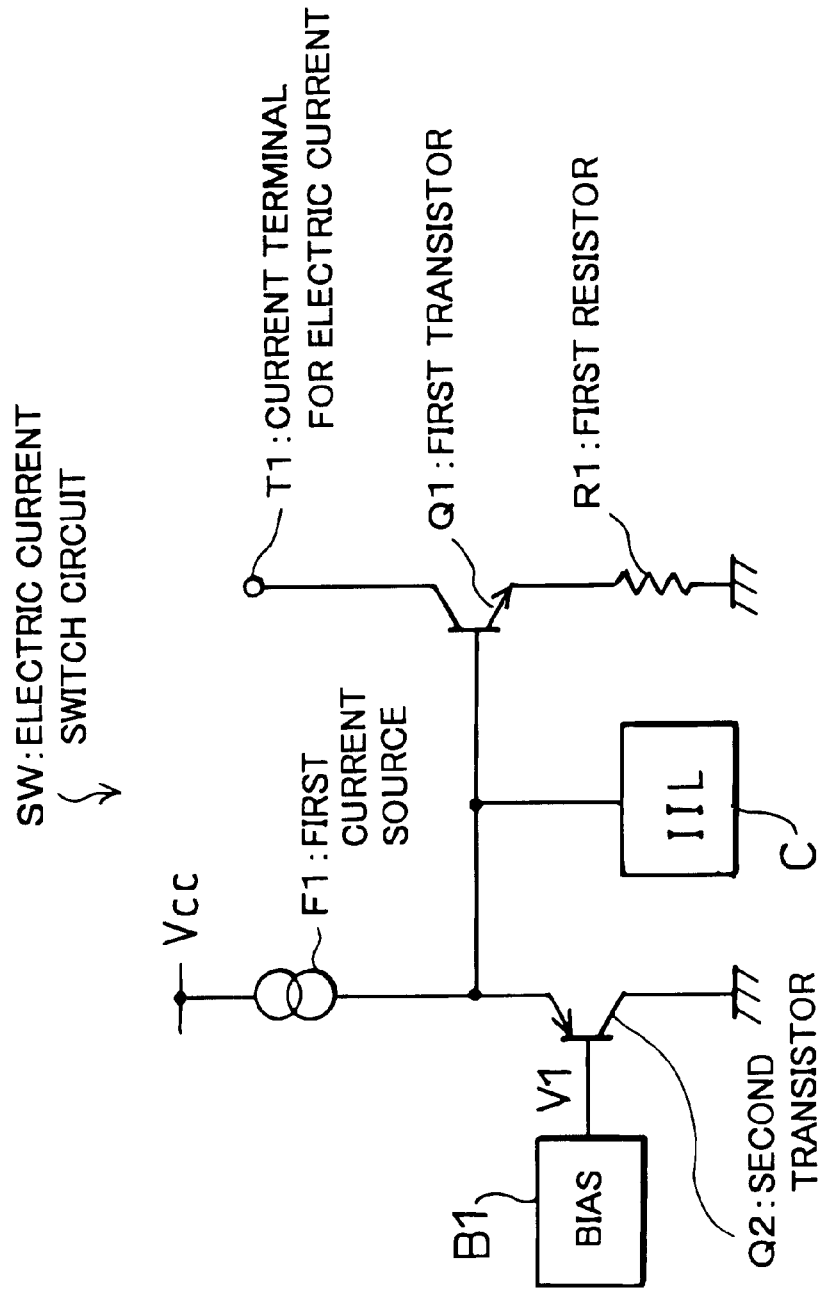
FIG. 1 is a circuit diagram showing an electric current switch circuit of the first embodiment in accordance with the present invention.
Figure 2:
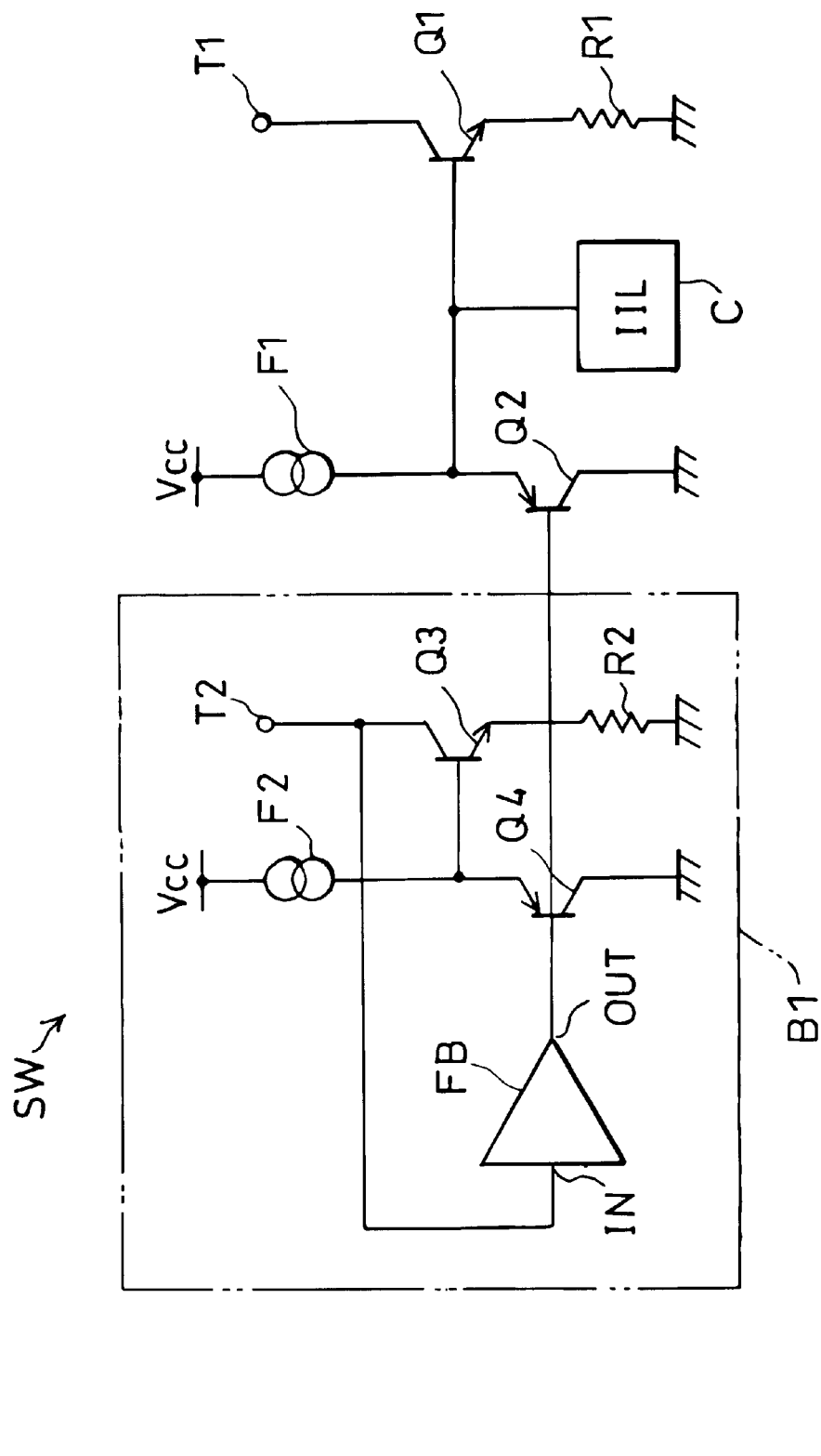
FIG. 2 is a circuit diagram showing a structure of a voltage bias circuit in the electric current switch circuit shown in FIG. 1.

The following description deals with the first embodiment of the present invention with reference to FIGS. 1 and 2.

FIG. 1 is a circuit diagram showing an electric current switch circuit SW of the first embodiment of the present invention. The electric current switch circuit SW switches ON or OFF the electric current flowing through an output terminal T1 for the electric current in response to an output of an IIL logic circuit C. An output terminal of the IIL logic circuit C is connected with the base of an NPN transistor Q1 that switches ON or OFF the electric current flowing through the output terminal T1. The collector of the NPN transistor Q1 is connected with the output terminal T1. The emitter of the NPN transistor Q1 is grounded through a resistor R1. The resistor R1 is provided so that the output electric current of the NPN transistor Q1 does not greatly change in response to an extremely small change of an input voltage during the receiving of a low input voltage.

The base of the NPN transistor Q1 is connected with the emitter of a PNP transistor Q2. A power source of a high level Vcc applies an electric current of about several micron ampere ($\mu A$), for example, to the base of the NPN transistor Q1 through a constant current source F1. In the PNP transistor Q2, the collector is grounded and the base receives a bias voltage V1 from a voltage bias circuit B1.

With the arrangement, when the IIL logic circuit is in an OFF state (the output of the IIL logic circuit C is in an OFF state), the base of the NPN transistor Q1 receives,. from the constant current source F1 and the PNP transistor Q2, a bias voltage that is higher by the base-emitter voltage Vbe(Q2) than the bias voltage V1, i.e., a bias voltage of V1+Vbe(Q2). The emitter of the NPN transistor Q1 receives a voltage of (V1+Vbe(Q2)−Vbe(Q1)) that is lower by the base-emitter voltage Vbe(Q1) than the bias voltage applied to the base. Namely, the emitter of the NPN transistor Q1 receives a voltage that is substantially equal to the bias voltage Vi. As a result, the NPN transistor Q1 switches ON so that a constant electric current flows through its collector, i.e., the output terminal T1. When the drop voltage VR1 across the resistor R1 is 0.3V, for example, only a voltage of 0.9V to 1.1V (=VR1+Vbe) is applied to the base of the NPN transistor Q1 that is connected with the output terminal of the IIL logic circuit, even when the IIL transistor is in an OFF state. Accordingly, a voltage more than the withstand voltage of the IIL transistor is not applied to the base of the NPN transistor Q1.

In contrast, when the IIL transistor is in an ON state, the base voltage of the NPN transistor Q1 transistor substantially becomes zero voltage (0.1V to 0.2V). The NPN transistor Q1 switches OFF so as to make substantially zero the electric current flowing through the output terminal T1. Thus, it is possible to realize an electric current switch circuit SW that can carry out the switching in accordance with the output of the IIL logic circuit C. Note that this is similar to the case where the conventional electric current switch circuit and the level change circuit are combined with each other.

When it is assumed that the constant current source F1 is realized by a single PNP transistor, the electric current switch circuit SW can be realized by three transistors and one resistor. Thus, it is possible to reduce the chip area.

Unlike the conventional electric current switch circuit, since there are no structures for generating the constant electric current and for consuming the constant electric current other than the constant current source Fi for driving the NPN transistor Q1 of an electric current switching use, it is possible to reduce power consumption, irrespective of the switching ON or OFF of the NPN transistor Q1.

Further, it is possible to lower the voltage of the output terminal T1, i.e., the collector voltage of the NPN transistor Q1 up to 0.6V (=VR1+Vsat(Q1)). Therefore, it is possible to relieve the restriction required for operating the D/A converter or other devices, in which the electric current switch circuits SW is provided, in a low source voltage. It is possible to lower the lower limit of the output voltage, accordingly.

FIG. 2 is a circuit diagram showing the electric current switch circuit SW for explaining a structure of the voltage bias circuit B1. The same reference numerals are assigned to the members corresponding to those shown in FIG. 1. The voltage bias circuit B1 is provided with an NPN transistor Q3, a PNP transistor Q4, a resistor R2, a constant current source F2, and a feedback circuit FB. The NPN transistor Q3, the PNP transistor Q4, the resistor R2, and the constant current source F2 correspond to and have the same characteristics as those of the NPN transistor Q1, the PNP transistor Q2, the resistor R1, and the constant current source F1, respectively. The collector of the NPN transistor Q3 is connected with an input terminal T2 for the electric current. The output of the feedback circuit FB is sent to the bases of the respective PNP transistors Q2 and Q4 as the bias voltage V1.

With the provision of the voltage bias circuit B1, the output voltage of the feedback circuit is controlled so that the electric current, which has flown to the input terminal T2, flows to the collector of the NPN transistor Q3. Accordingly, when the output of the IIL logic circuit C is in an OFF state, the same electric current as the electric current which has flown to the input terminal T2 flows through the output terminal T1, i.e., the collector of the NPN transistor Q1, of the electric current switch circuit SW. When the circuit elements constituting the electric current switch circuit SW have the same characteristics as those of the circuit elements constituting the voltage bias circuit B1, the above-mentioned electric current is not affected by the changes of the characteristics of the circuit element, the ambient temperatures, or other factors.

Figure 3:
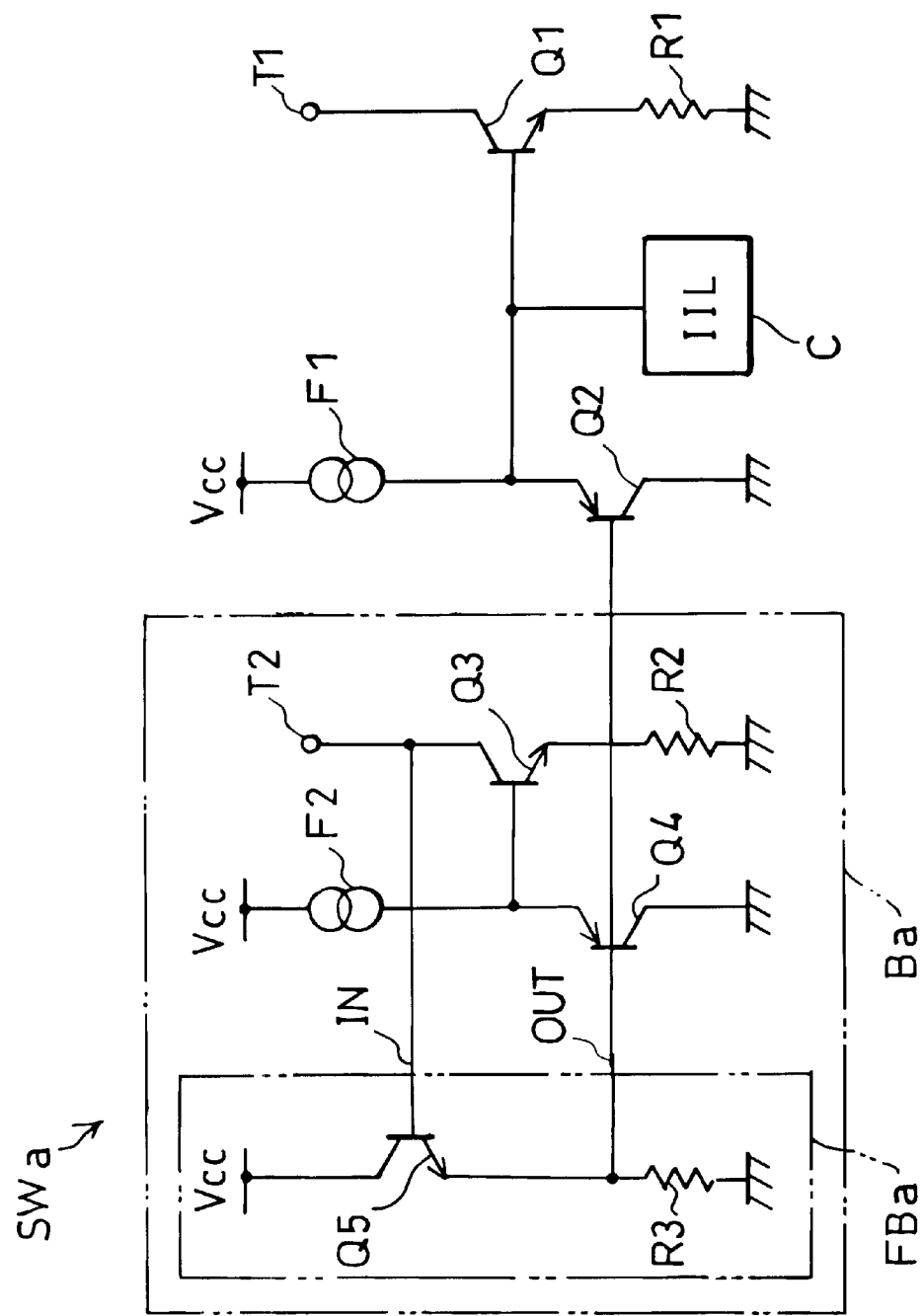
FIG. 3 is a circuit diagram showing an electric current switch circuit of the second embodiment in accordance with the present invention in which the voltage bias circuit is provided with a concrete structure of a feedback circuit shown in FIG. 2.

The following description deals with the second embodiment of the present invention with reference to FIG. 3.

FIG. 3 is a circuit diagram showing another electric current switch circuit SWa of the second embodiment in accordance with the present invention in which a voltage bias circuit Ba is provided with a feedback circuit FBa that is a concrete example of the feedback circuit FB. The feedback circuit FBa is provided with an NPN transistor Q5 having the collector to which a power source voltage of a high level Vcc is applied, the emitter, that serves as an output of the feedback circuit FBa, grounded through a resistor R3, and the base that serves as the input of the feedback circuit FBa. With the arrangement, it is possible to realize the feedback circuit FB by an extremely simple circuit configuration.

Figure 4:
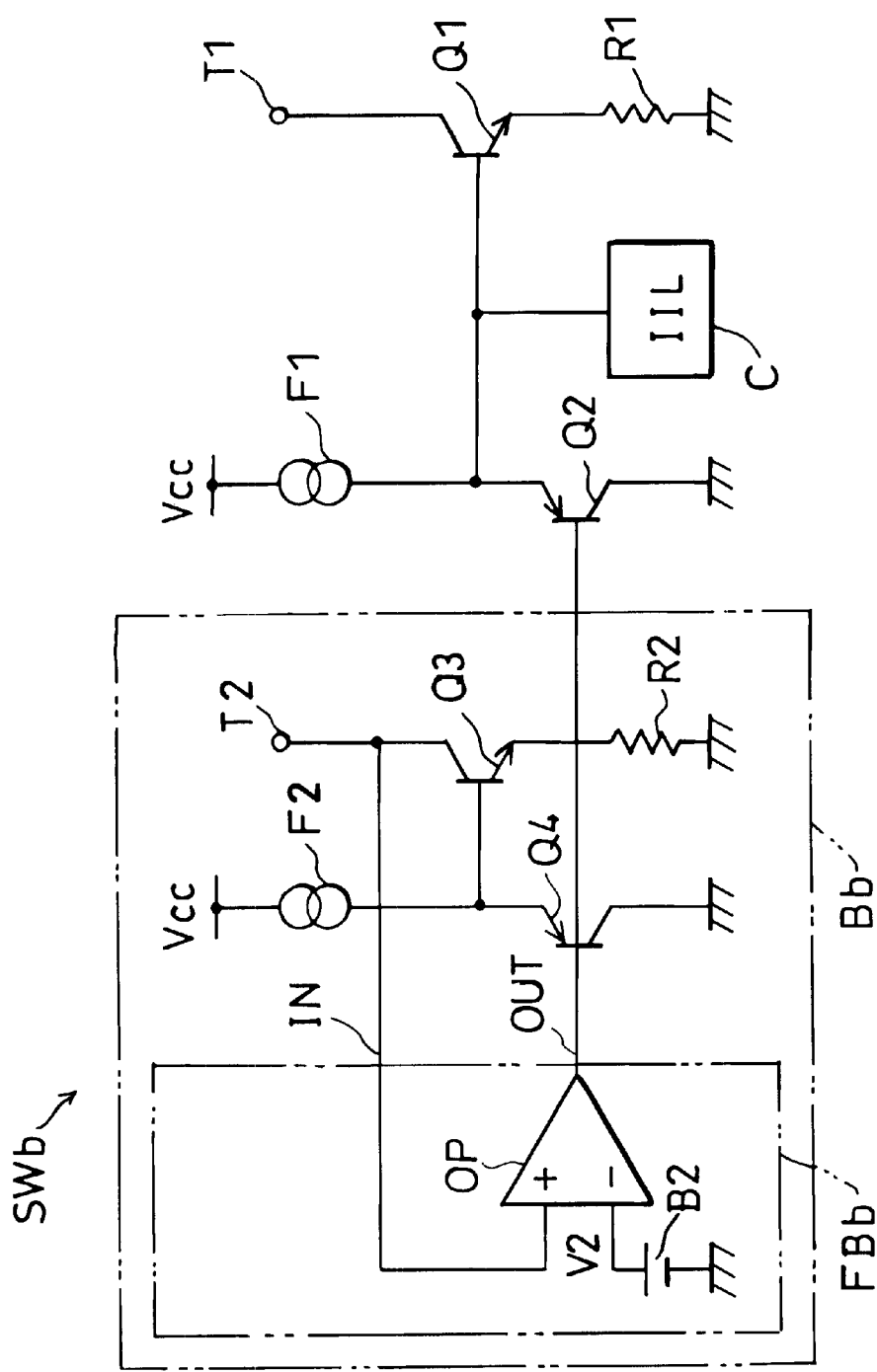
FIG. 4 is a circuit diagram showing an electric current switch circuit of the third embodiment in accordance with the present invention in which the voltage bias circuit is provided with another concrete structure of a feedback circuit shown in FIG. 2.

The following description deals with the third embodiment of the present invention with reference to FIG. 4.

FIG. 4 is a circuit diagram showing an electric current switch circuit SWa of the third embodiment in accordance with the present invention in which the voltage bias circuit Bb is provided with a feedback circuit FBb that is another concrete example of the feedback circuit FB. The feedback circuit FBb is constituted by an operational amplifier OP. More specifically, the input of the feedback circuit Fb is sent to a non-inverting terminal of the operational amplifier OP, a reference voltage V2 of a reference voltage source B2 is sent to an inverting input terminal of the operational amplifier OP, and an output terminal of the operational amplifier OP serves as the output of the feedback circuit FBb. With the arrangement, it is possible for the output electric current that has the same value as the electric current that has flown into through the input terminal T2 to flow through the input terminal T1, while the voltage of the input terminal T2 is maintained to have the same value as the reference voltage V2.

Figure 5:
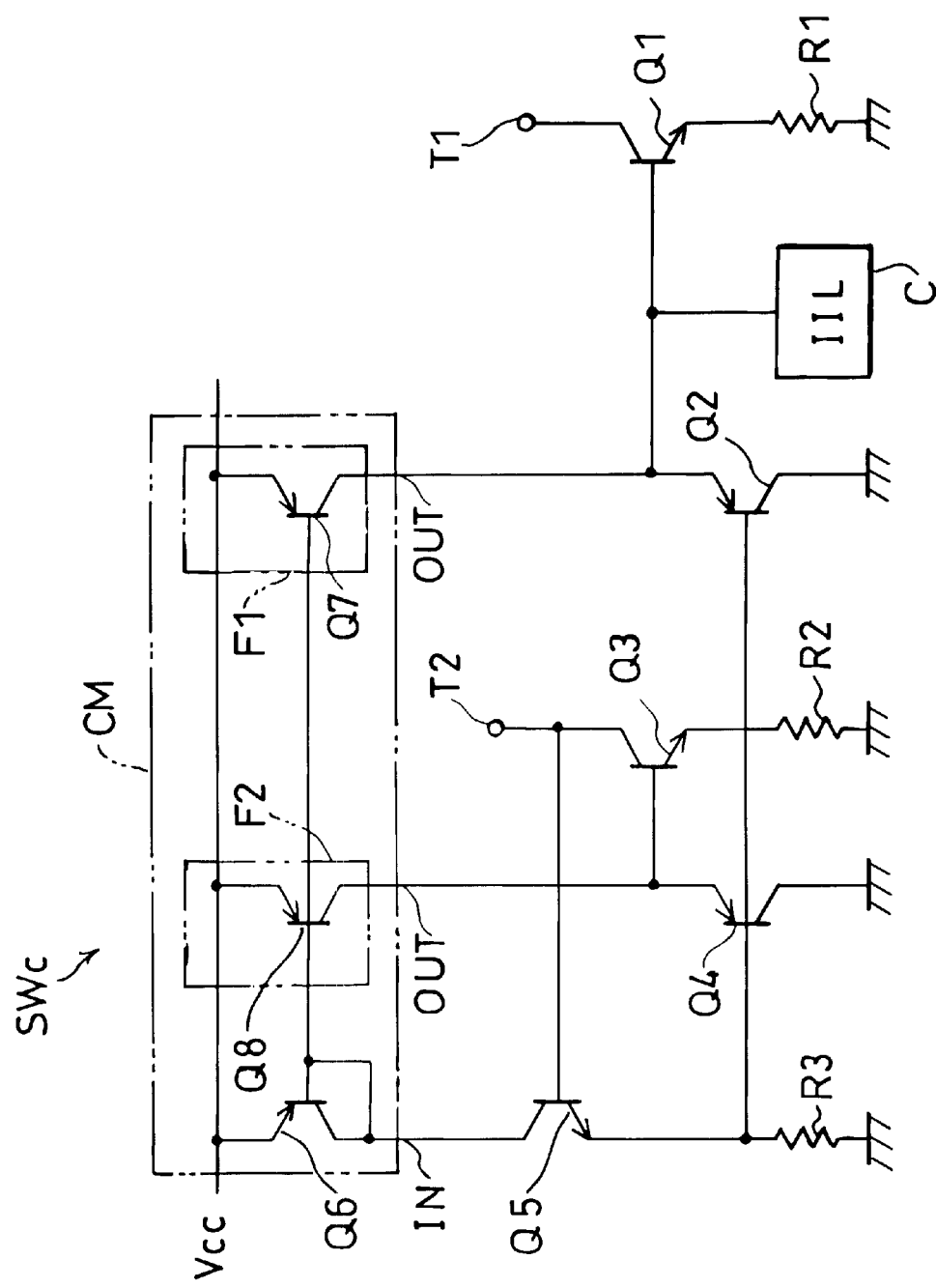
FIG. 5 is a circuit diagram showing an electric current switch circuit of the fourth embodiment in accordance with the present invention in which a constant current source of FIG. 3 is concretely shown.

The following description deals with the fourth embodiment of the present invention with reference to FIG. 5.

FIG. 5 is a circuit diagram showing an electric current switch circuit SWc of the fourth embodiment in accordance with the present invention and which provides a concrete example of the constant current sources F1 and F2. The electric current switch circuit SWc is analogous to the above-mentioned electric current switch circuit SWa. It should be noted that the collector of the NPN transistor Q5 is connected with the collector of the PNP transistor Q6 that serves as an input of a current mirror circuit CM, and the PNP transistors Q7 and Q8 serve as the respective constant current sources F1 and F2 as well as the respective outputs of the current mirror circuit.

With the arrangement, it is possible to obtain the reference electric currents outputted from the respective constant current sources F1 and F2 through the collector of the NPN transistor Q5. Accordingly, it is not necessary to newly provide current sources for generating the reference electric currents. Thus, it is possible to simplify the circuit configuration as well as to lower power consumption. Such an arrangement can be adopted because of the following reason. More specifically, it is required that the constant electric currents of the respective constant current sources F1 and F2 are relatively equal to each other, i.e., the absolute values thereof are not important. Based on the similar reason, the current mirror circuit CM can have the simple structure shown in FIG. 5. To provide a resistor to each of the emitters of the current mirror circuit CM or to replace the current mirror circuit CM with a current mirror circuit having another structure does not damage the essence of the present invention.

Figure 6:
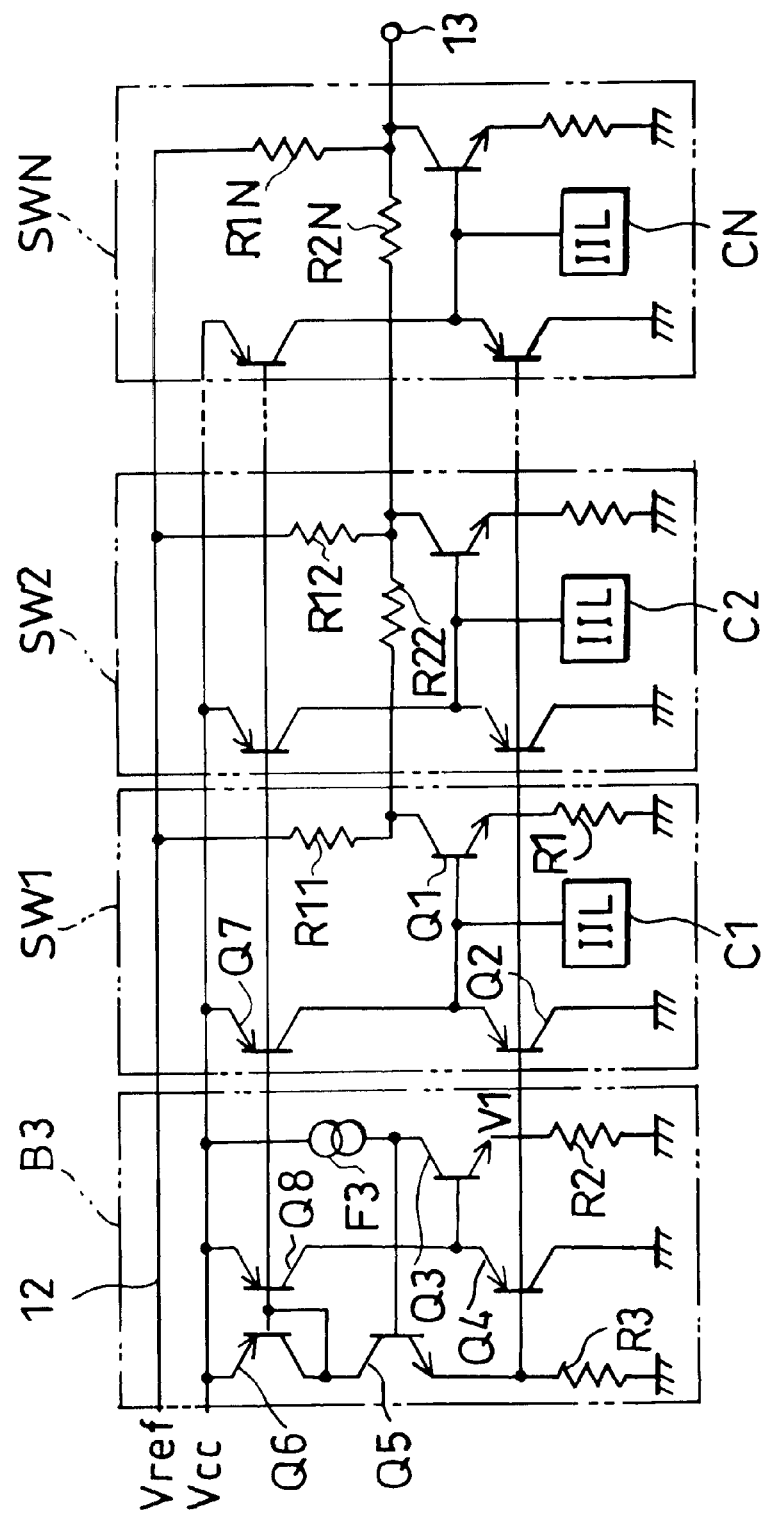
FIG. 6 is a circuit diagram in accordance with the fifth:embodiment of the present invention showing a D/A converter constituted by the electric current switch circuit shown in FIG. 5.

The following description deals with the fifth embodiment of the present invention with reference to FIG. 6.

FIG. 6 is a circuit diagram showing a D/A converter 11 constituted by the electric current switch circuit SWc shown in FIG. 5 in accordance with the fifth embodiment of the present invention.

The D/A converter 11 is of an N-bit R-2R resistor ladder type, and is provided with the above-mentioned electric current switch circuits SW1, SW2, SW3, . . . , and SWN. A bias circuit B3 is commonly provided to the respective electric current switch circuits SW1, SW2, SW3, . . . , and SWN.

A line 12 to which a reference voltage Vref is applied is commonly connected with each one end of resistors R1, R12, . . . , and R1N in the respective electric current switch circuits SW1, SW2, . . . , and SWN. Resistors R22, R23, . . . , and R2N are connected, respectively, between the other ends of the respective resistors R11, R12, . . . , and R1N. Such other ends are randomly switched ON and/or OFF with respect to a ground line by the respective electric current switch circuits SW1, SW2, . . . , and SWN. The ratio of each value of the respective resistors R12, . . . , and R1N and each value of the respective resistors R11, R22, R23, . . . , and R2N is selected so as to be 2:1. The resistors R11, R12, . . . , and R1N and the resistors R22, R23, . . . , and R2N constitute a resistor ladder circuit. The reference voltage Vref is divided in accordance with the combinations of the resistors R11, R12, . . . , and R1N and the resistors R22, R23, and R2N so as to be outputted as a D/A converted signal from the above-mentioned other end of the resistor R1N in the electric current switch circuit SWN of the last stage to an output terminal 13.

The base of the PNP transistor Q4 in the bias circuit B3 is commonly connected with the bases of the respective PNP transistors Q2 in the electric current switch circuits SW1 through SWN. Thus, the bias voltage V1 is applied to the bases of the respective PNP transistors Q2. The bases of the respective NPN transistors Q7 in the electric current switch circuits SW1 through SWN are connected with the bases of the PNP transistors Q6 and Q8, thereby forming a current mirror circuit. The respective NPN transistors Q7 serve as the constant current source F1. A constant current source F3 is connected with the collector of the NPN transistor Q3 that corresponds to the input terminal T2.

Thus, the electric current switch circuits SW1 through SWN independently switch ON and/or OFF in response to the outputs of the ILL logic circuits C1 through CN, respectively. Especially, in a circuit which includes a plurality of the foregoing electric current switch circuits SW1 through SWN, like a D/A converter 11, it is possible to mount them on an IC in a compact package by using the present invention, and is also possible to avoid increased manufacturing costs.

The present invention is not limited to the above-mentioned D/A converter 11 of resistor ladder type. For example, a plurality of electric current switch outputs are all connected with each other, thereby providing a D/A converter of electric current addition type. The following can be clear from the present embodiment. Namely, it is possible to obtain an electric current switch output having an M times (M: integer) larger electric current ratio by (a) making the area of the transistors in an electric current switch circuit be M times larger than that in the other electric current switch circuits and (b) making the resistor value of the transistors in such an electric current switch circuit be 1/M (M: integer) times smaller than that in the other electric current switch circuits. It is possible to provide a weighted D/A converter of electric current addition type by using such an electric current switch output having an M times (M: integer) larger electric current ratio. Other than this, the present invention can be adapted to a variety of usages in which the electric current should be switched ON and/or OFF in response to the outputs of the IIL logic circuit C.

For example, Japanese unexamined patent publication No. 60-20556 (publication date: Feb. 1, 1985) discloses as follows. More specifically, in an interface apparatus provided between an output of the IIL logic circuit and a bipolar transistor for switching ON or OFF the electric current, a P-type region is formed in an IIL logic region so as to face an injector, thereby providing a PNP transistor. The electric current flowing into the collector (the P-type region) is used as a base bias current of the bipolar transistor, thereby ensuring to convert the voltage level with a simple structure.

Figure 7:
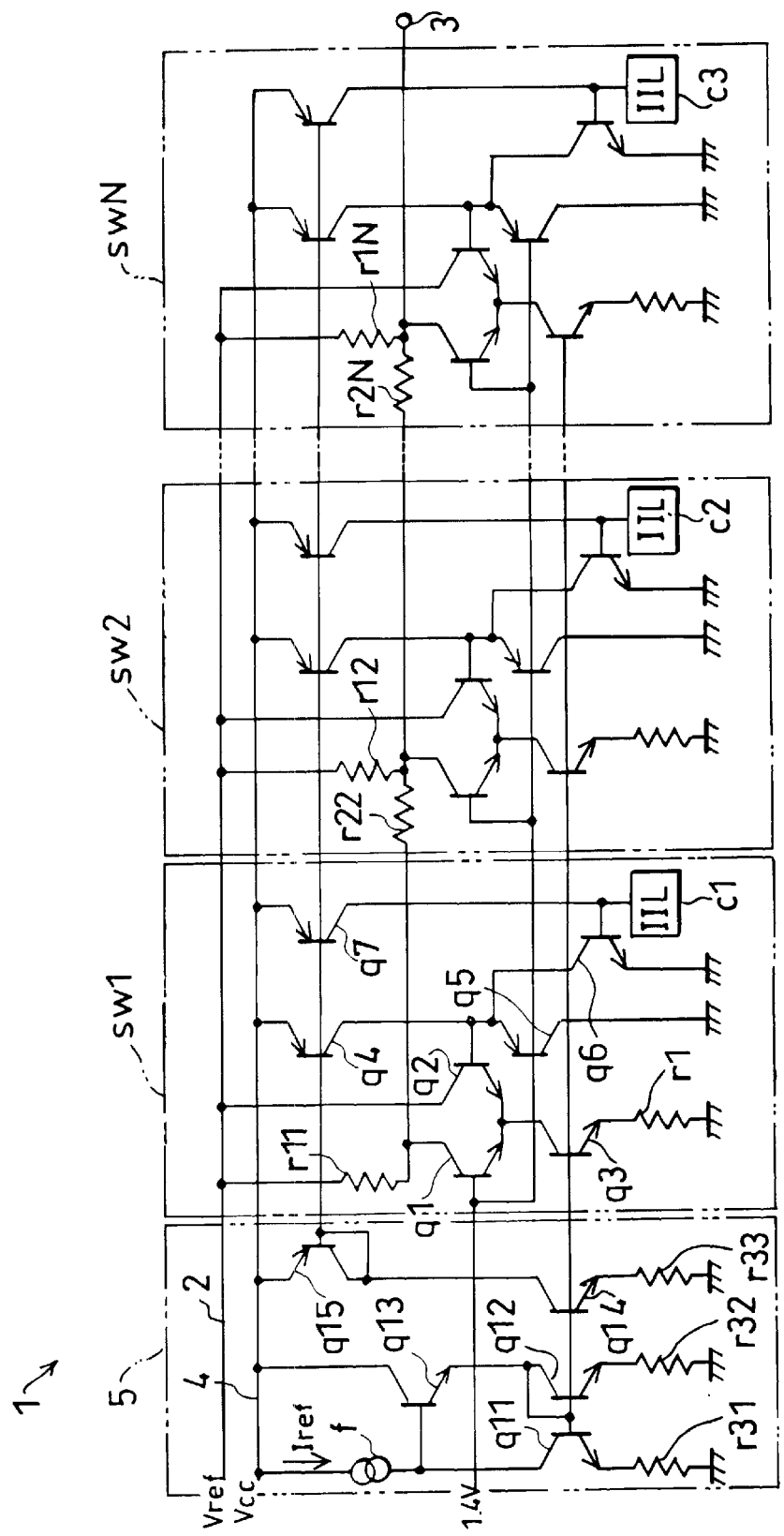
FIG. 7 is a circuit diagram showing a conventional D/A converter constituted by a typical conventional electric current switch circuit which receives an output of an IIL logic circuit.

Thus, the present invention and Japanese unexamined patent publication No. 60-20556 are both an output interface of the IIL logic circuit, and are analogous to each other in this point. However, the present invention relates to an electric current switch circuit while Japanese unexamined patent publication No. 60-20556 relates to an interface for a voltage level. For this, when replacing the PNP transistor q7 of FIG. 7 with the p-type region of Japanese unexamined patent publication No. 60-20556, the arrangement seems to be more simple. However, the base bias electric current for driving the NPN transistor q6 is formed by (a) the p-type region provided in the IIL logic region, (b) a substrate (N-type region), and (c) the injector region (p-type region). Accordingly, the base bias electric current is supplied by the PNP transistor that is in operation in a saturated manner. The base bias electric current is unstable because it is greatly affected by the unevenness of the base-emitter voltage of the NPN transistor q6 due to the saturated operation. When the base bias electric current becomes smaller than a limit, the bipolar transistor of NPN-type output does not appropriately operate.

For this reason, Japanese unexamined patent publication No. 60-20556 is not relevant prior art, but the arrangement in which the constant current source composed of the lateral PNP transistor q7 is used as the base bias of the NPN transistor q6.

Also known are other prior arts such as Japanese unexamined patent publication No. 1-105572 (publication date: Apr. 24, 1989) that discloses an output interface for an IIL logic circuit. This output interface operates in a similar manner to Japanese unexamined patent publication No. 60-20556 mentioned earlier. Accordingly, the explanation thereof is omitted here.

According to an electric current switch circuit in accordance with the present invention, as has been described above, which switches ON and/or OFF the electric current in response to the output of the IIL logic circuit, the output terminal of the IIL logic circuit is connected with the base of the first transistor of NPN type that switches ON and/or OFF as mentioned above. With the arrangement, when the ILL logic circuit is in an OFF state (the output terminal of the ILL logic circuit is in an OFF state), the first transistor of NPN type is switched ON by the first constant current source and the second transistor of PNP type. In contrast, when the ILL logic circuit is in an ON state (the output terminal of the ILL logic circuit is in an ON state), the first transistor of NPN type is switched OFF.

Therefore, when the first transistor of NPN type switches ON, the base of the first transistor of NPN type receives a bias voltage that is higher by the base-emitter voltage Vbe of the second transistor of PNP type than the bias voltage of the voltage bias circuit. The emitter of the first transistor of NPN type receives a voltage that is lower by the base-emitter voltage Vbe of the first transistor of NPN type than the bias voltage applied to the base. Namely, the emitter of the first transistor of NPN type receives a voltage that is substantially equal to the bias voltage. When the drop voltage VR1 across the resistor R1 is 0.3V, for example, only a voltage of 0.9V to 1.1V (=VR1+Vbe) is applied to the base of the first transistor of NPN type. Accordingly, a voltage more than the withstand voltage of the IIL transistor is not applied to the base of the first transistor of NPN type.

When it is assumed that the first constant current source is realized by a single PNP transistor, the electric current switch circuit can be realized by three transistors and one resistor according to the electric current switch circuit of the present invention. This allows the chip area to be reduced. Especially, in a circuit which is mounted by a plurality of the foregoing electric current switch circuits like a D/A converter, it is possible to mount them on an IC in a compact package and is possible to avoid increased manufacturing costs.

Unlike the conventional electric current switch circuit, since there are no structures for generating the constant electric current and for consuming the constant electric current other than the first constant current source for driving the first transistor of an electric current switching use, it is possible to reduce power consumption, irrespective of the switching ON or OFF of the first transistor.

Further, it is possible to lower the voltage of the output terminal for electric current, i.e., the collector voltage of the first transistor up to 0.6V (=VR1+Vsat). Therefore, it is possible to relieve the restriction required for operating the D/A converter or other devices having the foregoing electric current switch circuits in a lower source voltage. It is possible to lower the lower limit of the output voltage, accordingly.

According to the electric current switch circuit of the present invention, the foregoing voltage bias circuit is provided with the third and fourth transistors corresponding to the respective first and second transistors, and a second current source corresponding to the first current source, and a feedback circuit in which an input is applied through an input terminal for the electric current and an output is commonly applied to the bases of the respective second and fourth transistors. With the arrangement, the output voltage of the feedback circuit is controlled so that the electric current, which has flown to the input terminal for the electric current, flows to the collector of the third transistor.

Accordingly, when the output of the IIL logic circuit is in an OFF state, the same electric current as the electric current which has flown to the input terminal for the electric current flows through the output terminal. Further, when the circuit elements constituting the electric current switch circuit have the same characteristics as those of the circuit elements constituting the voltage bias circuit, the above-mentioned electric current is not affected by the changes of the characteristics of the circuit element, the ambient temperatures, or other factors.

According to the electric current switch circuit of the present invention, the feedback circuit is composed of the fifth NPN transistor having a collector to which the power source voltage is applied, an emitter grounded through the third resistor that serves as the output of the feedback circuit, and a base that serves as the input of the feedback circuit.

With the arrangement, it is possible to realize the feedback circuit by an extremely simple circuit configuration.

According to the electric current switch circuit of the present invention, the feedback circuit is constituted by an operational amplifier. More specifically, the input of the feedback circuit is sent to the non-inverting terminal of the operational amplifier, the reference voltage of the reference voltage source is sent to the inverting input terminal of the operational amplifier, and the output terminal of the operational amplifier serves as the output of the feedback circuit.

With the arrangement, it is possible to obtain from the output terminal the output electric current that has the same value as the electric current that has flown through the input terminal for the electric current while the voltage of the input terminal for the electric current is maintained to have the same value as the reference voltage.

According to the electric current switch circuit of the present invention, the collector of the fifth transistor is connected with a collector of the sixth PNP transistor that serves as an input of the current mirror circuit, and seventh and eighth PNP transistors that serve as the respective first and second constant current sources as well as serve as the respective outputs of the current mirror circuit.

With the arrangement, it is not necessary to newly provide current sources for generating the reference electric currents. Accordingly, it is possible to simplify the circuit configuration and also is possible to save the power consumption.

A D/A converter in accordance with the present invention is provided with a plurality of electric current switch circuits having the structure of any one of the above-mentioned ones that are connected with each other in which the bases of the respective second transistors are commonly connected with each other.

With the arrangement, it is possible to obtain many electric current switch outputs that can be independently switched ON and/or OFF and that have a single electric current value. Thus, the D/A converter having many electric current switch circuits can be mounted with respect to an IC of a compact package. Further, it is possible to avoid that the manufacturing cost increases.

There are described above novel features which persons skilled in the art will appreciate give rise to advantages. These are each independent aspects of the invention to be covered by the present application, irrespective of whether or not they are included within the scope of the following claims.

What is claimed is:

1. An electric current switch circuit which switches ON or OFF an electric current in response to an output of an IIL logic circuit, comprising:
   a first transistor of NPN type, that has a base connected with an output terminal of the IIL logic circuit and a collector that is an output terminal through which the electric current flows, for switching ON or OFF the electric current;
   a first resistor through which an emitter of the first transistor is grounded;
   a first constant current source for supplying the base of the first transistor with a bias electric current;
   a second transistor of PNP type, that has an emitter connected with the base of the first transistor and a collector that is grounded, for controlling a voltage of the output terminal of the IIL logic circuit; and
   a voltage bias circuit for supplying the base of the second transistor with a bias voltage.

2. The electric current switch circuit as set forth in claim 1, said voltage bias circuit comprising:
   a feedback circuit in which an input is applied through an input terminal for the electric current and the bias voltage is sent to the base of the second transistor through an output;
   a third transistor of NPN type, having a collector that serves as the input terminal for the electric current;
   a second resistor through which an emitter of the third transistor is grounded;
   a second constant current source for supplying a base of the third transistor with a bias electric current; and
   a fourth transistor of PNP type, having an emitter connected with the base of the third transistor, a collector that is grounded, and a base connected with the out put terminal of the feedback circuit.

3. The electric current switch circuit as set forth in claim 2, said feedback circuit comprising a fifth transistor of NPN type, having a collector to which a power source voltage is applied, an emitter that is grounded through a third resistor and serves as the output of the feedback circuit, and a base that serves as the input of the feedback circuit.

4. The electric current switch circuit as set forth in claim 2, said feedback circuit comprising an operational amplifier, the input of the feedback circuit is sent to a non-inverting terminal of the operational amplifier, a reference voltage of a reference voltage source is sent to an inverting input terminal of the operational amplifier, and an output terminal of the operational amplifier serves as the output of the feedback circuit.

5. The electric current switch circuit as set forth in claim 3, further comprising a sixth transistor of PNP type, having a collector connected with the collector of the fifth transistor, said sixth transistor serving as an input of a current mirror circuit, and seventh and eighth transistors of PNP type, serving as the respective first and second constant current sources as well as serving as respective outputs of the current mirror circuit.

6. A D/A converter having a plurality of electric current switch circuits, each of the circuits which switches ON or OFF an electric current in response to an output of an IIL logic circuit, said each electric current switch circuit comprising: (a) a first transistor of NPN type, that has a base connected with an output terminal of the IIL logic circuit and a collector that is an output terminal through which the electric current flows, for switching ON or OFF the electric current; (b) a first resistor through which an emitter of the first transistor is grounded; (c) a first constant current source for supplying the base of the first transistor with a bias electric current; (d) a second transistor of PNP type, that has an emitter connected with the base of the first transistor and a collector that is grounded, for controlling a voltage of the output terminal of the IIL logic circuit; and (e) a voltage bias circuit for supplying the base of the second transistor with a bias voltage,
   wherein said plurality of electric current switch circuits are connected in series with each other in which the bases of the respective second transistors are commonly connected with each other.

7. The D/A converter set forth in claim 6, said voltage bias circuit comprising:
   a feedback circuit in which an input is applied through an input terminal for the electric current and the bias voltage is sent to the base of the second transistor through an output;
   a third transistor of NPN type, having a collector that serves as the input terminal for the electric current;
   a second resistor through which an emitter of the third transistor is grounded;
   a second constant current source for supplying a base of the third transistor with a bias electric current; and
   a fourth transistor having an emitter connected with the base of the third transistor, a collector that is grounded, and a base connected with the output terminal of the feedback circuit.

8. The D/A converter set forth in claim 7, said feedback circuit comprising a fifth transistor of NPN type, having a collector to which a power source voltage is applied, an emitter grounded through a third resistor that serves as the output of the feedback circuit, and a base that serves as the input of the feedback circuit.

9. The D/A converter set forth in claim 7, said feedback circuit comprising an operational amplifier, the input of the feedback circuit is sent to a noninverting terminal of the operational amplifier, a reference voltage of a reference voltage source is sent to an inverting input terminal of the operational amplifier, and an output terminal of the operational amplifier serves as the output of the feedback circuit.

10. The D/A converter set forth in claim 8, further comprising a sixth transistor of PNP type, having a collector connected with the collector of the fifth transistor, said sixth transistor serving as an input of a current mirror circuit, and seventh and eighth transistors of PNP type, serving as the respective first and second constant current sources as well as serving as respective outputs of the current mirror circuit.

11. An electric current switch circuit, comprising:

an IIL logic circuit;

a bias voltage generation circuit that generates a bias voltage;

a first switching circuit that switches ON or OFF a constant electric current in accordance with whether the IIL logic circuit switches ON or OFF; and a control circuit to which the bias voltage is inputted, and which applies a voltage that is substantially equal to the bias voltage so as to switch ON the first switching circuit during switching OFF of the IIL logic circuit and so as to switch OFF the first switching circuit during switching ON of the IIL logic circuit said control circuit comprising a constant current source and a second switching circuit that are connected in series with each other, an output terminal of the ILL logic circuit being connected to a connecting point at which the constant current source and the second switching circuit are connected, and the first switching circuit being switched in accordance with a voltage of the connecting point.

* * * * *